United States Patent [19]

Takahashi

[11] Patent Number: 5,382,811
[45] Date of Patent: Jan. 17, 1995

[54] HIGH CONTRAST LED MATRIX

[75] Inventor: Nozomu Takahashi, Kawasaki, Japan

[73] Assignee: Kabushiki Kaisha Toshiba, Kawasaki, Japan

[21] Appl. No.: 215,971

[22] Filed: Mar. 18, 1994

Related U.S. Application Data

[63] Continuation of Ser. No. 894,759, Jun. 5, 1992, abandoned.

[30] Foreign Application Priority Data

Jun. 7, 1991 [JP] Japan .................. 3-136832
May 11, 1992 [JP] Japan .................. 4-117489

[51] Int. Cl.⁶ .................. H01L 33/00; H01L 31/12; H01L 31/16
[52] U.S. Cl. .................. 257/88; 257/81; 257/82; 257/91; 257/99; 257/100; 313/500
[58] Field of Search .................. 257/81, 82, 88, 99, 257/100; 313/499, 500, 501, 510, 512; 362/DIG. 800

[56] References Cited

U.S. PATENT DOCUMENTS

| | | | |
|---|---|---|---|
| 3,950,844 | 4/1976 | Wisbey | 313/500 |
| 4,485,377 | 11/1984 | Claus et al. | 340/719 |
| 4,929,866 | 5/1990 | Murata et al. | 313/500 |
| 4,933,545 | 6/1990 | Saaski et al. | 250/227.14 |
| 5,036,248 | 7/1991 | McEwan et al. | 313/500 |
| 5,162,879 | 11/1992 | Sasagawa et al. | 257/88 |

*Primary Examiner*—William D. Larkins
*Assistant Examiner*—Valencia Martin Wallace
*Attorney, Agent, or Firm*—Oblon, Spivak, McClelland, Maier, & Neustadt

[57] ABSTRACT

An optical semiconductor device having a substrate; a plurality of light-emitting diodes disposed in a specific arrangement on the substrate; a peripheral member for housing the substrate and the light-emitting diodes; a first resin layer formed on an area of said substrate within the peripheral member and not occupied by said light-emitting diodes, for securing the light-emitting diodes between the substrate and the peripheral member; and a second resin layer formed on the first resin layer, wherein: minute irregularities are formed on the second resin layer so that external light directed onto the exposed surface of the second resin layer is diffusedly reflected.

7 Claims, 5 Drawing Sheets

HIGH CONTRAST LED MATRIX

This application is a continuation of application Ser. No. 07/894,759, filed on Jun. 5, 1992, now abandoned.

BACKGROUND OF THE INVENTION

1. Field of the Invention

The present invention relates to an optical semiconductor device in the form of an optical semiconductor device formed from a plurality of light-emitting diodes arranged in set intervals which displays specific data by ON and OFF combinations, and, in particular, to an optical semiconductor device which can display data clearly, irrespective of changes in the amount of incident external light or of the position of a person viewing the display.

2. Description of the Prior Art

Conventionally, an optical semiconductor device as a display unit formed from light-emitting diodes in a plurality of locations arranged in matrix form can display specified data when the light-emitting diodes are set to ON or to OFF. At the present time, such an optical semiconductor device is widely used both indoors and outdoors as a display device such as a display panel in which a specific number of light-emitting diodes are combined.

For example, these display devices are installed on the shoulder of a highway to provide road data for drivers, or the like, or are installed in railway stations to provide passengers with a guide to the departure and arrival times of the trains. FIG. 1A is a plan view of an optical semiconductor device 1 used as a display unit for a conventional display device. This display device 1 is fabricated from nine light-emitting diodes 2.

The light-emitting diodes 2 are arranged in a peripheral member 3 in a systematic matrix form. A resin 4 is filled between the light-emitting diodes 2 of the peripheral member 3 to secure the light-emitting diodes 2 in the peripheral member 3. FIG. 1B is a sectional view along a line A—A' of the optical semiconductor device 1 of FIG. 1.

For example, a plurality of optical semiconductor devices 1 are combined and arranged in one plane, for example, to form a display device for information in a railroad station as stated above. FIG. 2A is a plan view of a display device 7 used as a display unit, formed by combining a plurality of conventional optical semiconductor devices 1. FIG. 2B is a sectional view along a line B–B' of the display device 7 shown in FIG. 2A.

In the display device 7 shown in FIG. 2A, for example, in the case of an outdoor installation, the sunlight shines directly onto the light-emitting diodes 2, which are, specifically, LED lamps. In this case, it is difficult to distinguish whether the LED lamps 2 are illuminated or extinguished, so, as a result, there is the problem that the displayed data cannot be understood. Conventionally, to solve this problem, a louver 5, for example, is provided in one part of the peripheral member 3 of the optical semiconductor device 1, as shown in FIG. 1B, so that external light does not shine directly onto the LED lamp 2.

As a result, when the LED lamp 2 is extinguished it is difficult for external light to be directed onto the LED lamp 2 or the resin 4 and there is a large difference between the amount of light from the light-emitted diode 2 when the light-emitting diode 2 is lighted and the amount of light from the resign 4 in the optical semiconductor device 1 when the diode 2 is extinguished. Specifically, the clarity of contrast in the total optical semiconductor device 1 is large. Accordingly, a good display is possible.

However, the optical semiconductor device 1 is arranged in matrix form to form the display device 7, and when a long louver 5 is provided in the peripheral member 3 to restrain the effect of external light, the visibility in the display device 1 in the vertical direction in particular is lost. For this reason, there are cases where the louver 5 must be short, depending on the location at which the display device 1 is installed and the magnitude of the display portion. For example, in the case of a display device utilizing the optical semiconductor device shown in FIG. 1A and FIG. 1B, there are occasions when the LED lamp 2 is difficult to see when viewed from the B direction. For this reason, the louver 5 must be short.

In such a case, the louver 5 cannot block out a sufficient amount of external light, and when the LED lamp 2 is illuminated or extinguished, the contrast in a specific direction is poor.

In addition, the resin 4 used for setting the light-emitting diode 2 in the peripheral member 3 normally has a low viscosity. Specifically, in the case where a high viscosity resin is used, it is run into the perimeter of the light-emitting diode 2 and cured to avoid the production of cavities at the periphery of the light-emitting diode 2. However, when a low viscosity resin is used a mirror-like surface is formed. As a result, external light directed onto the surface of the resin 4 is reflected in a specific direction so that it is impossible to understand the display data.

As a countermeasure for such inconveniences, the reflection of external light from the LED lamp 2 can be restrained to a certain extent by changing the shape of the LED lamp 2. However, no effective countermeasure has as yet been found for the resin problem.

As explained above, in a conventional optical semiconductor device 1 utilizing a display device which is mainly for outdoor application, a long louver 5 for blocking out the light provided to the peripheral member 3 cannot be used, therefore external light is strongly reflected from the surface of the resin 4 which is filled into the peripheral member 3. This gives rise to the drawback that the optical semiconductor device, specifically, the display device, is difficult to see.

SUMMARY OF THE INVENTION

Accordingly, an object of the present invention is to provide, with due consideration to the drawbacks of such conventional devices, an optical semiconductor device constructed so that incident light from an external source is not reflected in a specific direction, thus improving the contrast, which is the difference between the degree of brilliance when a display device is lighted and the degree of brilliance when the display device is extinguished, and, in addition, to provide an optical semiconductor device which has a display function whereby the viewer can correctly and clearly recognize the displayed data.

As a preferred embodiment according to the present invention, an optical semiconductor device comprises:
 a substrate;
 a plurality of light-emitting diodes disposed in a specific arrangement on the substrate;
 a peripheral member for housing the substrate and the light-emitting diodes;

a first layer filled between the substrate in combination with the peripheral member, and the light-emitting diodes, for securing the light-emitting diodes between the substrate and the peripheral member; and a second layer formed on the first layer, wherein:

minute irregularities are formed on the second layer so that external light directed onto the exposed surface of the second layer is diffusedly reflected.

As another preferred embodiment according to the present invention, an optical semiconductor device comprises:

a substrate;

a plurality of light-emitting diodes disposed in a specific arrangement on the substrate;

a peripheral member for housing the substrate and the light-emitting diodes;

a layer filled between the substrate in combination with the peripheral member, and the light-emitting diodes, for securing the light-emitting diodes between the substrate and the peripheral member; wherein:

minute irregularities are formed on the layer so that external light directed onto the exposed surface of the layer is diffusedly reflected.

BRIEF DESCRIPTION OF THE DRAWINGS

These and other objects, features, and advantages of the present invention will become more apparent from the following description of the preferred embodiment taken in conjunction with the accompanying drawings, in which.

DETAILED DESCRIPTION OF THE PREFERRED EMBODIMENTS

Other features of this invention will become apparent in the course of the following description of exemplary embodiments which are given for illustration of the invention and are not intended to be limiting thereof. An embodiment of the present invention will now be explained, based on the drawings.

Figure 3:
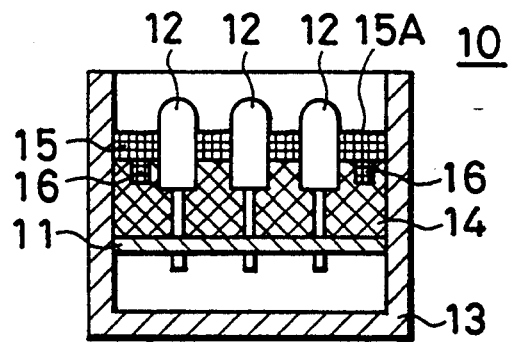
FIG. 3 is a sectional view of a first embodiment of an optical semiconductor device of the present invention.

FIG. 3 is a sectional view of a first embodiment of an optical semiconductor device of the present invention.

In FIG. 3, a plurality of light-emitting diodes, for example, a plurality of LED lamps 12 in an optical semiconductor device 10, connected to a printed substrate 11 are arranged in the form of a matrix and housed in a peripheral member 13, and a first layer of resin 14 is filled in to enclose one part of the periphery of the LED lamp 12. In addition, a light dispersion member 15 is formed as a second layer and joined to the first layer of resin 14 as a special feature of this first embodiment of the present invention. Specifically, with the exception of its light-emitting portion, one part of the periphery of the LED lamp 12 is formed of a two-layer laminated structure made up of the first layer of resin 14 and the second light dispersion member layer 15.

Next, the method of forming this first embodiment of the optical semiconductor device of the present invention will be described with reference to FIG. 4A, FIG. 4B, and FIG. 4C.

Figure 4A:
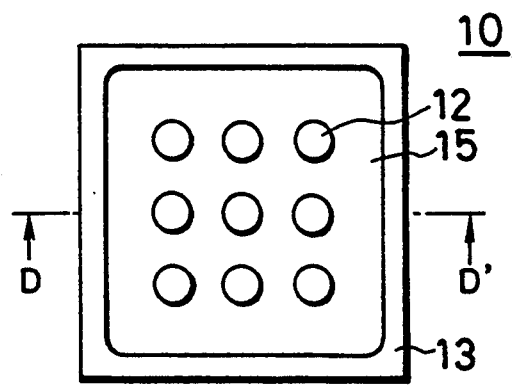
FIG. 4A is a plan view of the optical semiconductor device shown in FIG. 3.

FIG. 4A is a plan view of the optical semiconductor device shown in FIG. 3; FIG. 4B is a sectional view of the light dispersion member 15 as the second layer of the optical semiconductor device shown in FIG. 3; and FIG. 4C is a sectional view of the first layer of resin 14 as the first layer of the optical semiconductor device shown in FIG. 3. An opening 16H is provided in each of the four corners of the first layer of resin 14 through which a projection 16 of the second layer light dispersion member 15 is inserted.

Figure 4B:
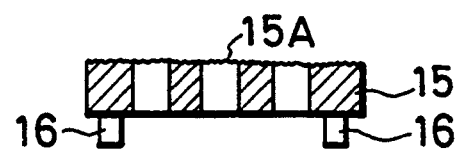
FIG. 4B is a sectional view of a second layer 15 of the optical semiconductor device shown in FIG. 3.
Figure 4C:
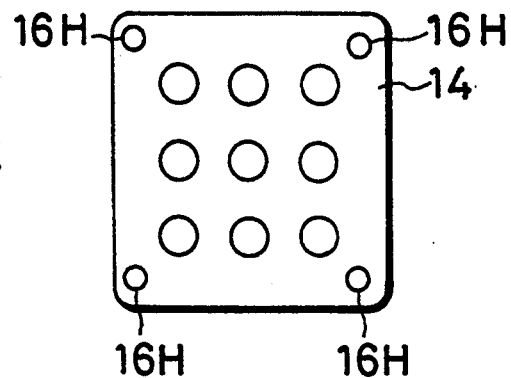
FIG. 4C is a plan view of a first layer 14 of the optical semiconductor device shown in FIG. 3.

On the light dispersion member 15 as the second layer of this laminated structure, as shown in FIG. 4B, a surface 15A opposite to the surface joined to the resin 14, specifically, the surface in contact with the atmosphere, is formed by a process which provides minute irregularities.

Various processing methods can be given, but, for example, in one method, resin as the light dispersion member 15 is injected softened on one surface of a metal die with minute granulated particles attached.

With the light dispersion member 15 formed in this manner, prior to the first layer of resin 14 being filled between the light-emitting diodes 12 in the peripheral member 13, the projections 16 provided on the surface of the light dispersion member 15 are inserted under pressure into the resin 14 and temporarily secured, after which they are fully secured in the resin 14 as a result of the curing process, and are securely positioned in the peripheral member 13.

As described above, the exposed surface 15A of the light dispersion member 15 is processed as an irregular surface. Therefore, external light directed onto the surface of the light dispersion member 15 is diffusedly reflected, not reflected in one specific direction. Further, if the second layer light dispersion member 15 is black it will absorb the external light so that the amount of reflected light from the second layer surface 15A can be reduced.

As a result, when the LED lamps 12 are extinguished, even when external light enters the optical semiconductor device, the reflected light over the entire optical semiconductor device is restrained, and the difference in the amount of light from the entire device between the periods when the LED lamps 12 are illuminated and the periods when the LED lamps 12 are extinguished is improved. Accordingly, in a display device formed by arranging this type of optical semiconductor device 10 in matrix form, there are no problems of the device being difficult to see, as with a conventional display device, and a clear display can be obtained.

Further, in the first embodiment, the light dispersion member 15 is formed from resin, but the present invention is not restricted to this construction, and the light dispersion member 15 may, for example, be formed of metal. In addition, a filler member as the resin 14 of the first layer and a filler member as the light dispersion member 15 of the second layer may also be joined by, for example, an adhesive, without providing projections 16 in the rear surface of the filler member as the light dispersion member 15 of the second layer.

Figure 1A:
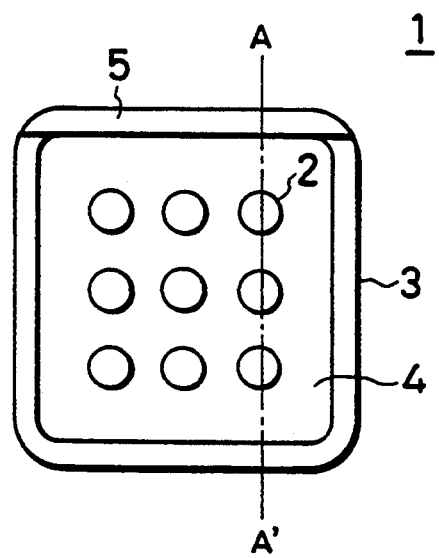
FIG. 1A is a plan view of a conventional optical semiconductor device.
Figure 1B:
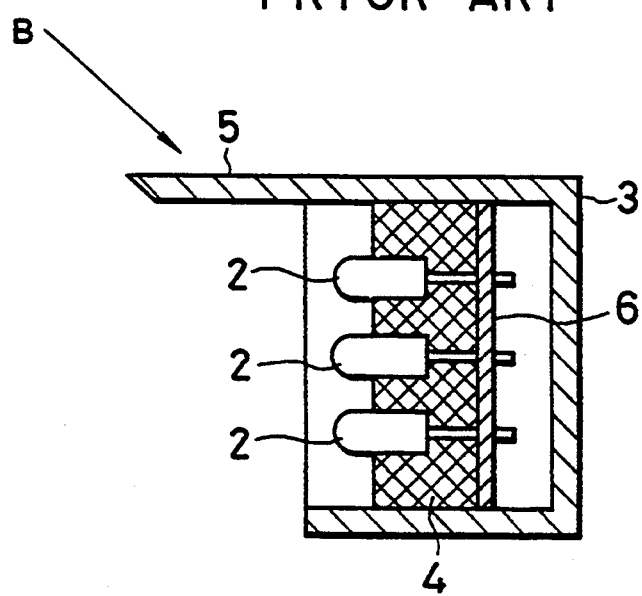
FIG. 1B is a sectional view along a line A—A' of the optical semiconductor device 1 shown in FIG. 1.
Figure 2A:
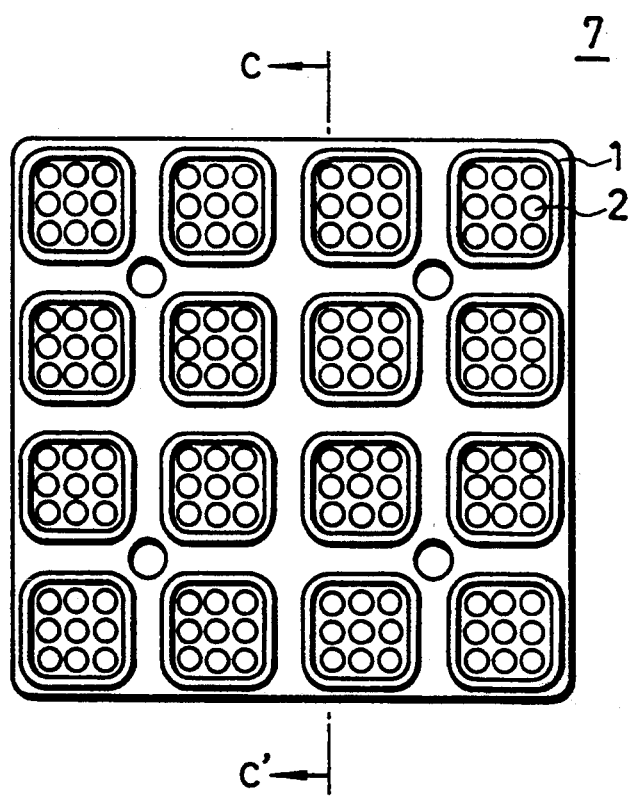
FIG. 2A is a plan view of a conventional display device used as a display unit, formed by combining a plurality of optical semiconductor devices shown in FIG. 1A.
Figure 2B:
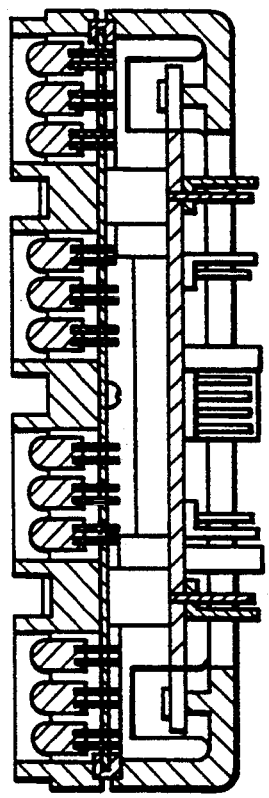
FIG. 2B is a sectional view of the display device shown in FIG. 2A.
Figure 5:
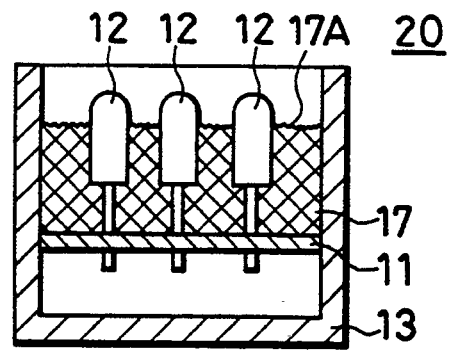
FIG. 5 is a sectional view of a second embodiment of an optical semiconductor device of the present invention.

FIG. 5 is a sectional view of a second embodiment of an optical semiconductor device of the present invention. Reference numerals in FIG. 5, FIG. 6, and FIG. 7 which are the same as reference numerals in FIG. 1 designate identical or corresponding parts. Further explanation of these parts is therefore omitted here.

The special features of the embodiment of the present invention shown in FIG. 5 are as follows. With the exception of its light-emitting portion, one part of the periphery of the LED lamp 12 is filled with a resin 17, and the exposed surface 17A of this resin 17 is processed to provide an irregular surface.

As a method for directly processing the surface 17A of the filled member of the resin 17 or the like, there is the processing method whereby, when, for example, the filled resin 17 is in a softened state, a tape-shaped cloth is applied by pressure to the surface 17A of the resin 17. After the resin 17 has hardened, the mesh pattern of the cloth is transferred to the resin surface 17A by removing this cloth, so that minute irregularities are provided to the surface. In the resulting optical semiconductor device 20, the resin 17 having an irregular surface processed by a method of this type, can obtain the same type of results as a filled member as in the previously-described optical semiconductor device 10 of the first embodiment.

Figure 6:
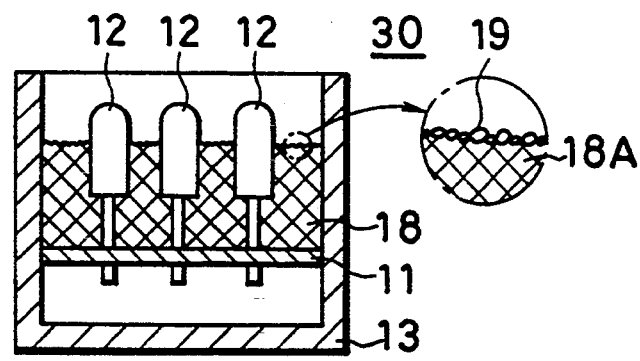
FIG. 6 is a sectional view of a third embodiment of an optical semiconductor device of the present invention.

FIG. 6 is a sectional view of a third embodiment of an optical semiconductor device of the present invention.

An optical semiconductor device 30 as shown in FIG. 6, which is the third embodiment of the present invention, has the following features.

In contrast with the optical semiconductor device 20 of the above-described second embodiment, by scattering a black resin 19 formed of minute granules as a second layer onto a surface 18A of a filler resin 18 directly after the resin 18 has been filled in, the layer of black resin 19 produces irregularities in the resin surface 18. In this type of embodiment it is also possible to obtain the same effects as in the optical semiconductor devices 10, 20 of the previously-described embodiments, and the same type of effect is obtained even if the granules are removed after scattering.

Figure 7:
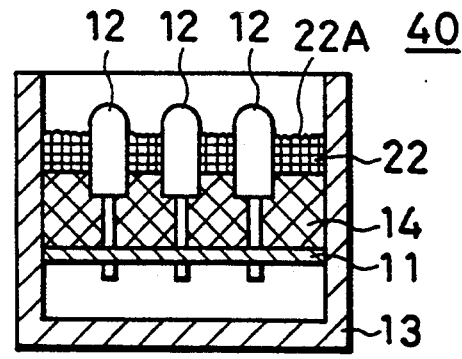
FIG. 7 is a sectional view of a fourth embodiment of an optical semiconductor device of the present invention.

FIG. 7 is a sectional view of a fourth embodiment of an optical semiconductor device of the present invention. An optical semiconductor device 40 as shown in FIG. 7, which is the fourth embodiment of the present invention, has the following features. In contrast with the optical semiconductor device 10 of the first embodiment shown in FIG. 3, a resin member 22 is formed as a second layer from a high-viscosity resin, and the exposed surface 22A of the resin member 22 is processed to give an irregular surface.

Any of the previously-described methods can be applied to form these irregularities. Other methods which can also be used include, for example, applying a resin into which has been blended minute glass or silica granules. In addition, the second layer may be formed from a metal formed into the shape of glass granules.

Figure 8:
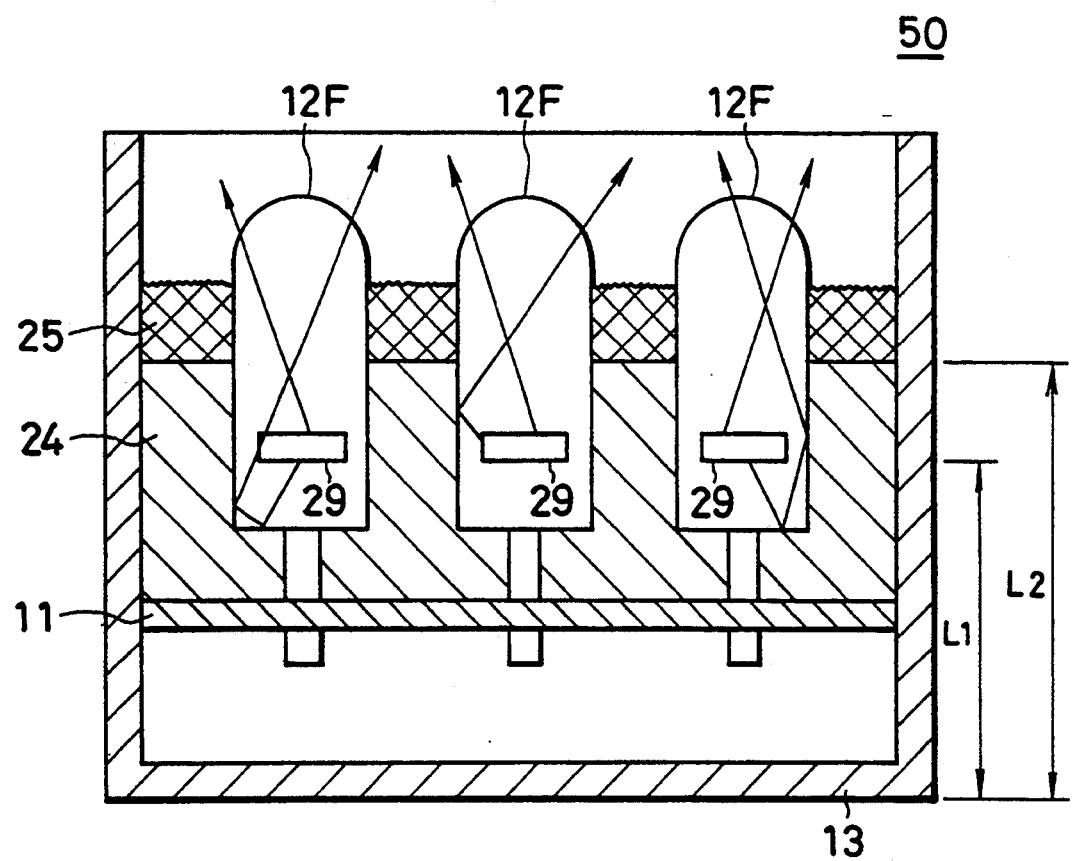
FIG. 8 is a sectional view of a fifth embodiment of an optical semiconductor device of the present invention.

This method can also be used with the previously-described embodiments. The same type of effect can be obtained in this embodiment of the optical semiconductor device of the present invention as in the previously-described optical semiconductor device 10, 20, 30. FIG. 8 is a sectional view of an optical semiconductor device 50 of a fifth embodiment of the present invention. A filler resin 24 made from, for example, a white resin may be used on the bottom of the first layer in the drawing to increase the light reflectance. In this case, the light emitted from the sides and bottom of the light-emitting diodes can be recovered at a front surface 12F of each light-emitting diode, and the degree of brightness of the light-emitting diode is intensified.

As a result, the displayed data can be easily understood. In this embodiment, as shown in FIG. 8, a position L1 of a pellet 29 must be set at a small distance from a position L2 which is the height of the boundary between the first and second layers.

In the optical semiconductor device 10 of the first embodiment of the present invention, the projections 16 and the openings 16H for securely joining the first layer of resin 14 and the second layer 15 were cylindrical.

Figure 9:
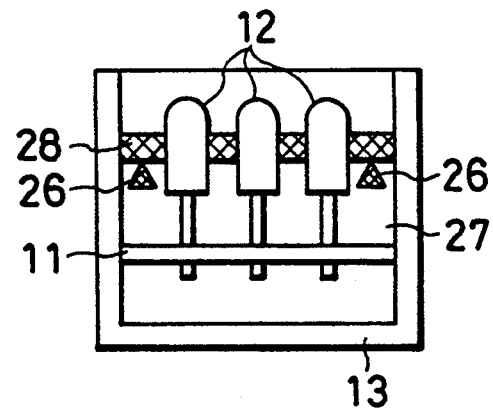
FIG. 9 shows a modified example of a projection section of the first embodiment of the present invention.

However, the embodiment is not limited to this shape. As shown in FIG. 9, the cross-section of the projection 26 of the second layer 28 opposing the first layer of resin may be, for example, triangular to strengthen the joint between the first and second layers.

When the first resin layer 27 of this embodiment is completely cured, a stronger bond is obtained between the second layer 28 and the first resin layer 27 than between the first layer of resin 14 and the second layer 15 of the optical semiconductor device of the previously-described first embodiment. Therefore, these layers can be peeled apart only with difficulty.

The present invention is not limited to the above-described embodiments. For example, when the display device in which the light-emitting diodes are arranged in matrix form is fabricated, a louver may be provided on the peripheral member 13 to the extent that the data cannot be missed when seen from an angle.

From the foregoing explanation, by means of the present invention, the exposed surface of the filler resin filled into the peripheral member in which the light-emitting diodes are housed is formed from a layer which can scatter or absorb the incident light. Therefore, the reflection in a specific direction of external light incident on the exposed surface of the filled member can be restrained.

As a result, an optical semiconductor device can be provided which easily and clearly displays recognizable data over the entire device by the illumination and extinction of the light-emitting diodes.

What is claimed is:

1. An optical semiconductor device comprising:
 a substrate;
 a plurality of light emitting diodes arrayed in a matrix on said substrate;
 a peripheral member for housing said substrate and said plurality of light emitting diodes;
 a first layer formed of a white resin having a high reflection factor which can reflect light irradiated from said plurality of light emitting diodes, said first layer being disposed on an area of said substrate within said peripheral member and being penetrated by said plurality of light emitting diodes, for securing said plurality of light emitting diodes between said substrate and said peripheral member; and a second layer formed of a black resin, said second layer being disposed on said first layer and being penetrated by said plurality of light emitting diodes.

2. An optical semiconductor device according to claim 1, wherein an exposed surface of said second layer diffusedly reflects external incident light directed onto said exposed surface of said second layer.

3. An optical semiconductor device comprising:
a substrate;
a plurality of light emitting diodes arrayed in a matrix on said substrate;
a peripheral member for housing said substrate and said plurality of light emitting diodes;
a first layer formed of a white resin which is disposed on an area of said substrate within said peripheral member and which is penetrated by said plurality of light emitting diodes, for securing said plurality of light emitting diodes between said substrate and said peripheral member; and
a second layer formed of a black resin which is disposed on said first layer, an exposed surface of said second layer diffusedly reflecting external incident light directed onto said exposed surface of said second layer, wherein said second layer is provided with projecting sections at specific positions on a non-exposed surface thereof which contact corresponding openings provided in said first layer for accommodating said projecting sections.

4. An optical semiconductor device according to claim 3, wherein said projecting sections are formed in a cylindrical shape.

5. An optical semiconductor device according to claim 3, wherein said projecting sections project toward said first layer and are formed in a fan shape.

6. An optical semiconductor device comprising:
a substrate;
a plurality light emitting diodes arrayed in a matrix on said substrate;
a peripheral member for housing said substrate and said plurality of light emitting diodes; and
a layer formed of a black resin which absorbs incident external light, said layer being disposed on an area of said substrate within said peripheral member and being penetrated by said plurality of light emitting diodes, for securing said plurality of light emitting diodes between said substrate and said peripheral member.

7. An optical semiconductor device according to claim 6, wherein an exposed surface of said layer diffusedly reflects external incident light directed onto said exposed surface of said layer.

* * * * *